United States Patent [19]

Stellmach

[11] Patent Number: 5,080,454
[45] Date of Patent: Jan. 14, 1992

[54] ARRANGEMENT FOR DETACHABLY SECURING TOGETHER PAIRS OF SUBSTANTIALLY PERPENDICULAR STRUCTURAL PARTS

[75] Inventor: Dieter Stellmach, Bad Dürrheim, Fed. Rep. of Germany

[73] Assignee: Mannnesmann Aktiengesellschaft, Düsseldorf, Fed. Rep. of Germany

[21] Appl. No.: 686,274

[22] Filed: Apr. 15, 1991

Related U.S. Application Data

[63] Continuation of Ser. No. 434,091, Nov. 9, 1989, abandoned.

[30] Foreign Application Priority Data

Nov. 11, 1988 [DE] Fed. Rep. of Germany ....... 3838777

[51] Int. Cl.$^5$ .............................................. A47B 48/00
[52] U.S. Cl. .................................. 312/263; 403/408.1
[58] Field of Search ............ 312/111, 140, 263, 265.5, 312/257.1, 108; 220/4.02, 3.2; 403/380, 388, 408.1

[56] References Cited

U.S. PATENT DOCUMENTS 2,153,259  4/1939  Manning .......................... 403/408.1
4,116,510  9/1978  Franco ................................ 312/263

FOREIGN PATENT DOCUMENTS 3710624  10/1988  Fed. Rep. of Germany ... 403/408.1

Primary Examiner—Kenneth J. Dorner
Assistant Examiner—Gerald Anderson
Attorney, Agent, or Firm—Cohen, Pontani & Lieberman

[57] ABSTRACT

An arrangement for detachably securing together pairs of substantially perpendicular thin-walled, planar, generally flat structural parts (1, 2) which may define wall, top, bottom and/or side members as in the frame of data processing apparatus. A first structural part (1) is provided with calibrated slot openings (3a) for receiving contoured projections (4) on the second structural part (2). The first part (1) also includes at least a passage (8) through which a threaded screw (6) is journaled, and the second part (2) is provided with a cutout 10, opposite the screw passage (8) and aligned with the passage axis (9), configured and dimensioned for engagement with the threads of the screw (6). This arrangement enables detachable securement of the first and second structural parts (1, 2) utilizing a minimum of separate components and a minimum number of assembly steps or operations thus yielding a considerably more cost-effective attachment arrangement than heretofore known.

6 Claims, 2 Drawing Sheets

ARRANGEMENT FOR DETACHABLY SECURING TOGETHER PAIRS OF SUBSTANTIALLY PERPENDICULAR STRUCTURAL PARTS

This is a continuation of U.S. application Ser. No. 434,091, filed Nov. 9, 1989, now abandoned.

FIELD OF THE INVENTION

The present invention relates to an arrangement for effecting the detachable securement of substantially perpendicularly disposed pairs of thin-walled, planar, substantially flat structural parts which define walls as, for example, the top, bottom, intermediate or side panels, or portions thereof, of the frame in electronic data processing apparatus.

BACKGROUND OF THE INVENTION

Arrangements for effecting the detachable securement of perpendicular pairs of flat structural parts have heretofore been developed such, for example, as so-called slotted nut attachments (Federal Republic of Germany Utility Model No. 18 28 856). Such attachments are also known for thin-walled flat structural parts, as disclosed in Federal Republic of Germany Patent No. 35 39 505.

The first of two such known arrangements employs a specially shaped slotted nut. After its insertion in a slot of one of the two flat structural parts being secured together, the nut must be headed in a separate operation in order to prevent its falling out as the parts are handled or manipulated during assembly operations. The second known arrangement additionally requires a resilient plastic or metal part which includes a pair of detent noses. Thus, this second arrangement requires a multiplicity of components for effecting the detachable securement of the two flat structural parts—namely, the plastic part, a corresponding hexagon nut and, in addition, a bolt or screw and a washer.

Each of these known arrangements is, therefore, relatively expensive from the standpoints of both component expense and the labor required for completing their assembly, rendering these securement arrangements notably and undesireably cost-intensive.

SUMMARY OF THE INVENTION

It is accordingly the object of the present invention to provide an arrangement for detachably securing together a pair of substantially flat structural parts or members which are disposed at right angles to each other, wherein the arrangement requires both considerably fewer component parts, and fewer operations to complete their assembly, than the prior art solutions, thereby rendering the securement arrangement of the invention significantly more cost-favorable and effective.

This and other objects are achieved, in accordance with the invention, in a construction wherein the second of two flat structural parts or members to be detachably secured together is provided with contoured projections in the plane of the second structural part and which engage in calibrated slot openings in the first flat structural part. Defined in and through the first flat structural part are passages for screws and, in the second structural part, opposite and extending along the axis of each passage, a cutout that is dimensioned in accordance with the diameter and the length of insertion of the threaded core of a self-tapping screw. Thus, in addition to the two flat structural parts, the inventive arrangement consists almost exclusively of cutouts, projections and slot openings in the structural parts, all of which can be produced at low cost, with the self-tapping screw(s) serving substantially only for effecting a final and supplemental securement of the two structural parts. Such an arrangement can accordingly be manufactured and assembled at considerably lower cost than those heretofore known.

In a modified embodiment of the invention, wherein the second flat structural part has a polygonal contour, at least one cutout is defined in the first flat structural part so as to be open on one side in the direction of insertion parallel to the structural part surface; a projection of the second flat structural part is insertable into the cutout. This arrangement advantageously enables the detachable securement to the second part of a first structural part that is angularly bent to follow the peripheral contour of the second structural part and thereby form an integral sidewall or the like on the first structural part.

In a further modification wherein the second flat structural part has a polygonal contour, there is associated with another insertable projection of the second structural part a second cutout defined in the first structural part. This second cutout is also open on one side and substantially corresponds to the thickness of the second structural part, with the first and second cutouts extending at an angle—for example an acute angle—to each other. In effect, the second cutout provides, in association with the first cutout, an interlocking of the second flat structural part to the first structural part so that the subsequent insertion of the self-tapping screw(s) represents an additional and merely supplemental securement of the two structural parts in accordance with the invention.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference numerals denote similar elements throughout the several views.

DETAILED DESCRIPTION OF THE PREFERRED EMBODIMENTS

Figure 1:
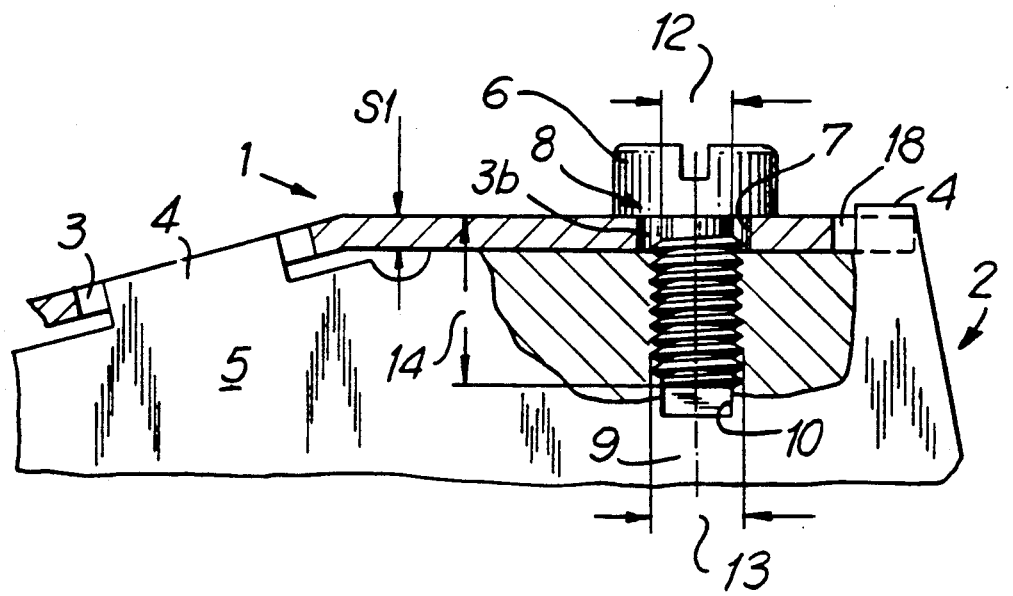
FIG. 1 is a sectional side view, partially broken away, of an arrangement detachably securing together two structural parts.
Figure 2:
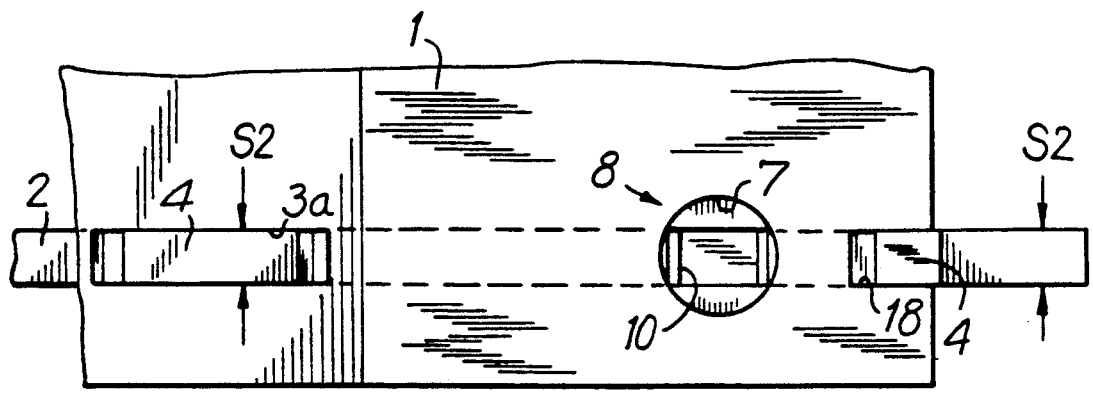
FIG. 2 is a top plan view of the arrangement of FIG. 1, but omitting the self-tapping screw.
Figure 3:
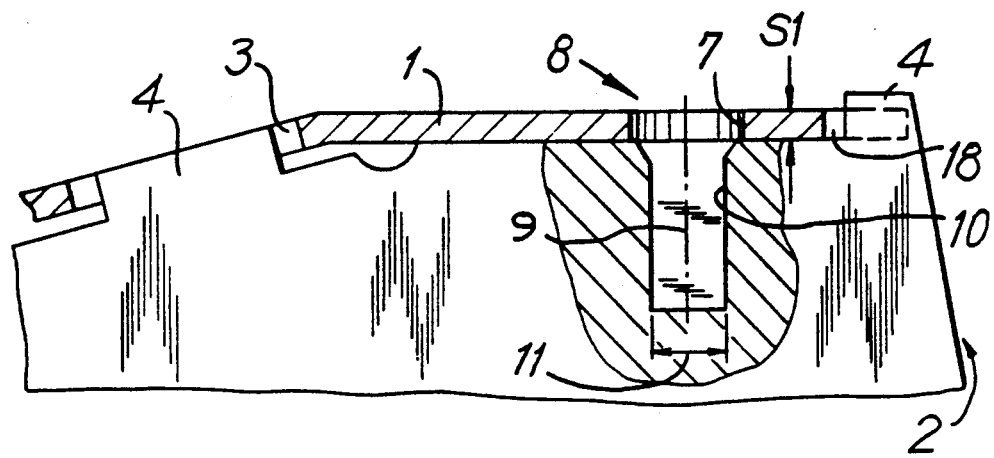
FIG. 3 is a sectional side view corresponding to FIG. 1, but omitting the self-tapping screw.

The present invention is directed to an arrangement for detachably securing together two (i.e. first and second) structural parts or members in substantially perpendicular or otherwise abutting or intersecting relation. As currently comtemplated, the two parts are generally substantially flat—or at least have substantially flat sections or portions—and substantially planar, and may comprise frame members which define the top, and/or bottom, and/or side and/or other wall(s) of an apparatus, as for example in a printer or other data processing device or environment. For example, in the form of the invention illustrated in FIGS. 1 to 3 of the drawings, the first structural part or member 1 forms the top, and the second structural part or member 2 forms a side wall, of an apparatus frame or frame portion, the first and second members 1, 2 being disposed in perpendicularly abutting relation. The present invention specifically provides a particularly advantageous arrangement for detachably securing together these two structural members in their intended generally perpendicular orientations.

The structural parts 1 and 2 are relatively thin-walled—for example approximately 1 mm thick—in at least the region of their abutment or detachable securement. The first part 1 includes at least one cutout or opening 3 for receiving an extension or projection 4 defined on the second structural part 2. Preferably, a plurality of such projections 4 lie in the plane 5 of the second part 2 for engagement with correspondingly-located openings 3 of the first part 1. For this purpose, the cutouts 3 are defined as calibrated or suitably contoured and dimensioned slots 3a (FIG. 2) into which the projections 4, fabricated by way of example having generally rectangular configurations, engagingly fit.

One or more of the cutouts 3 may be suitably widened, as at 3b (FIG. 1), for the receipt of a self-tapping or other screw 6. Alternatively, the screw(s) 6 may be received through round holes 7 which are defined in the first structural part 1. It will thus be understood that the screw(s) 6 are receivable in and through one or more of the holes 7 and/or widened slots 3b which may, collectively, be thought of as passages 8. As should also be apparent the cutouts 3, calibrated slot openings 3a and widened slots 3b in the first structural part 1 may advantageously and conveniently be simultaneously formed and fabricated in a single stamping operation.

A cutout 10 is defined in the second structural part at a location for receiving the threaded shank or core of the screw 6. More particularly, with the first and second parts 1, 2 disposed in their abutting and substantially perpendicular relation, the cutout 10 extends along the axis 9 of the passage 8 and has an interior width or diameter 11 that substantially corresponds to the core diameter 12 of the threaded screw shank. Although it is normally contemplated that the structural parts 1, 2 be formed of steel plate or like material, where at least the second part 2 is fabricated of a relatively soft material the cutout interior diameter 11 is preferably dimensioned as no greater than 0.95 times the nominal diameter 13 of the screw thread.

The insertion length 14 of the screw 6 will depend upon the stress exerted, in use, on the attachment or securement arrangement of the two structural parts 1, 2. In practice, an insertion length 14 of up to twice the nominal thread diameter 13 of the screw has proven satisfactory, with twice the nominal thread diameter 13 being used for securement arrangements which are subjected to unusually high stresses or wherein the structural parts are fabricated of relatively soft material. Those skilled in the art will recognize that the thicknesses S1, S2 of the first and second structural parts 1, 2, respectively, will generally depend upon the structural requirements of the apparatus or frame of which the parts 1, 2 form a part.

Figure 4:
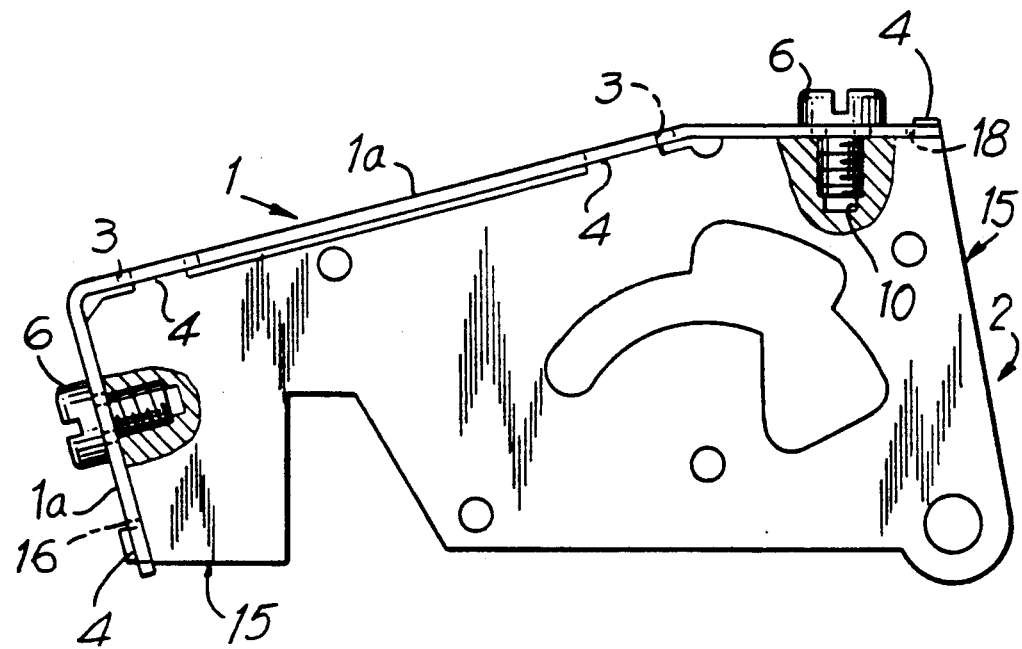
FIG. 4 is a side view of a practical embodiment of an arrangement, in accordance with the invention, for detachably securing two structural parts in a computer printer.

FIG. 4 illustrates a securement arrangement, in accordance with the invention, wherein the second flat structural part 2 is fabricated having a polygonal peripheral contour 15. In this arrangement the first structural part 1 is formed with bends that define a plurality of generally flat sections or portions 1a lying at substantial angles to one another and generally following the peripheral contour of the second structural part 2. A first cutout or recess 16 which is open on one side is formed transverse to the surface 1a in the first structural part 1 for receiving a projection 4 of the second structural part 4. The first part 1 may also be provided with a second cutout or recess 18 open on one side and substantially corresponding in width to the thickness S2 of the second part 2 for receiving another projection 4 of the second part 2. As illustrated in FIG. 4, the cutouts 16, 18 are defined, by way of example, at relatively acute angles to each other thus providing, in conjunction with the second part projections 4 received therein, an effectively interlocked connection or securement between the first and second structural parts 1, 2 so that the subsequent insertion of one or more screws 6 through the passage(s) 8 merely supplements the detachable securement of the parts 1, 2 so provided in accordance with the invention.

While there have been shown and described and pointed out fundamental novel features of the invention as applied to preferred embodiments thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims appended hereto.

What is claimed is:

1. An apparatus for detachably securing structural members in substantially perpendicular relation, comprising:

a first substantially flat planar structural member;

a second substantially flat planar and polygonally shaped structural member detachably securable to said first structural member and having a plurality of outer edges disposed in angular relation to one another;

said first structural member having a surface facing said second structural member which conforms and mates with at least two of said outer edges of said second structural member when said first and second members are secured;

a plurality of calibrated slot openings defined in said first structural member;

a plurality of projections projecting from said outer edges and lying in the plane of said second structural member, each of said projections contoured and located for engageable receipt in respective slot openings in said first member when said first and second structural members are disposed in said substantially perpendicular relation for detachable securement therebetween;

a passage defined in and through said first structural member at a distance from and functionally independent from said calibrated slot openings and having an axis and a substantially circular cross-sectional shape;

a threaded screw receivable in and through said passage and having a threaded shank and an insertion length;

a cutout defined in and along an outer edge of said second structural member positioned at a distance from and functionally independent from said projections and opposite said passage and extending along said passage axis when said first and second structural members are disposed in said substantially perpendicular relation for detachable securement therebetween, said cutout having an internal diameter dimensioned in accordance with said threaded shank and said insertion length for engagingly receiving said screw shank to facilitate the detachable securement of said first and second structural members such that upon insertion of said screw through said passage and into said cutout, said outer edge of said second structural member is pressed in flat abutting relation to said first member surface which conforms with and faces said second member, said second member is disposed outside said passage, and no force is exerted by said second member within said passage; and at least one of said outer edges of said second structural member is cutout-free and has at least one projection defined therein.

2. Apparatus for detachably securing together first and second substantially flat, planar structural members in substantially perpendicular relation in accordance with claim 1, wherein said screw comprises a self-tapping screw.

3. Apparatus for detachably securing together first and second substantially flat, planar structural members in substantially perpendicular relation in accordance with claim 1, wherein said second structural member has a polygonal contour and first and second surface portions, further comprising a first recess extending within said first structural member at said first surface portion for insertably receiving one of said projections of said second structural member, said first recess being open on one side in the direction of insertion of said one projection parallel to said first surface portion, and a second recess extending within said first structural member at said second surface portion for insertably receiving another of said projections of said second structural member, said second recess being open on one side and each of said first and second recesses having an axis which intersects the axis of the other of said recesses.

4. Apparatus for detachably securing together first and second substantially flat, planar structural members in substantially perpendicular relation in accordance with claim 3, wherein said second structural member has a thickness and at least one of said first and second recesses has a width that substantially corresponds to said thickness.

5. Apparatus for detachably securing together first and second substantially flat, planar structural members in substantially perpendicular relation in accordance with claim 1, wherein said second structural member has a thickness and said first recess has a width that substantially corresponds to said thickness.

6. Apparatus for detachably securing together first and second substantially flat, planar structural members in substantially perpendicular relation in accordance with claim 1, wherein said second structural member has a thickness and at least one of said slot openings has a width that substantially corresponds to said thickness.

* * * * *